United States Patent [19]

Massironi

[11] Patent Number: 5,075,941

[45] Date of Patent: Dec. 31, 1991

[54] PRESS STRIKING OF DIE STAMPED METAL FRAMES FOR SINGLE-IN-LINE PACKAGES FOR RE-ESTABLISHING PLANARITY AND PARALLELLISM OF THE OPPOSITE FACES OF THE PATTERNED PINS TO BE EVENTUALLY BENT

[75] Inventor: Angelo Massironi, Concorezzo, Italy

[73] Assignee: SGS-Thomson Microelectronics, Italy

[21] Appl. No.: 553,331

[22] Filed: Jul. 17, 1990

[30] Foreign Application Priority Data

Jul. 18, 1989 [IT] Italy ............................... 83631 A/89

[51] Int. Cl.$^5$ .......................... B21F 1/00; B23P 23/04; B23P 25/00; H01R 43/04
[52] U.S. Cl. .................................... 29/33 M; 29/874; 29/882; 140/105; 72/324
[58] Field of Search .................. 140/105, 147; 72/324, 72/335, 339, 336; 29/874, 882, 884, 33 M

[56] References Cited

U.S. PATENT DOCUMENTS 4,205,548 6/1980 Bothner et al. ...................... 72/335

4,553,420 11/1985 Fierkens et al. ...................... 140/105
4,772,912 3/1988 Gonzalez ............................. 140/147

FOREIGN PATENT DOCUMENTS 1084037 1/1955 France ................................... 29/874
62-275525 11/1987 Japan ................................... 140/105
155876 9/1956 Sweden ................................. 29/884

Primary Examiner—Robert L. Spruill
Attorney, Agent, or Firm—Pollock, Vande Sande & Priddy

[57] ABSTRACT

The outer portion of a die stamped metal frame encompassing the outer ends of the electrical connecting pins is subjected to press striking for re-establishing planarity and parallelism of the opposite faces of the patterned pins which have become deformed during the die stamping, before proceeding to the assembly operations. The eventual bending of the pins of the finished product between a bending punch and a contrasting punch is performed on pins having planar and parallel faces thus preventing twisting and slanting of the bent pins.

1 Claim, 1 Drawing Sheet

PRESS STRIKING OF DIE STAMPED METAL FRAMES FOR SINGLE-IN-LINE PACKAGES FOR RE-ESTABLISHING PLANARITY AND PARALLELLISM OF THE OPPOSITE FACES OF THE PATTERNED PINS TO BE EVENTUALLY BENT

BACKGROUND OF THE INVENTION

The present invention relates to the fabrication of Single-In-Line semiconductor devices, especially in a molded plastic package.

A large number of semiconductor devices are produced in so-called Single-In-Line (SIL) type packages of various shapes wherein all the pins of the device emerge from the same side of the package and are bent by pressing them between a pair of punches, respectively a bending and a contrasting punch, suitably set in a press. This is done both in the case of packages wherein all the pins remains coplanar as well as in packages wherein the pins are "splitted" in two orders or rows of pins, which once bent, become arranged on two parallel planes, spaced from each other.

The bending of the pins normally takes place at the end of the encapsulating process of the device as the last mechanical operation, naturally carried out in an automatic manner. Most often the devices so produced present their pins slanting in a more or less uniform manner toward one side instead of being correctly perpendicular to the face of the container from which they project. This slanting off from a correct perpendicular orientation of the pins, even if uniform, may cause inconveniences during the assembly of the devices on printed circuit cards, which is normally carried out by robots.

It has been observed that the cause of said lateral slanting of the pins during the bending of the same is due to lack of planarity and parallelism of their top and bottom surfaces which are engaged, respectively, by the bending punch and by the contrasting punch during the bending operation. The combined action of the two punches acting on faces which are not parallel to each other tends to twist laterally the pin upon bending it. A deformation of the cross section of the pins is often caused by die stamping the thin metal sheet, commonly of copper or of nickel plated copper, for patterning the assembly metal frame of the semiconductor chip through which also the pins are generated, which once the minuscule metal bridges left by the die stamping are eventually broken, will constitute the "isolated" pins of the device. The die stamping tends to deform in a similar but not identical way the cross section of all the pins thus causing different torsional and flexural moments upon the bending thereof. The problem worsens with the wearing of the die stamping punches.

OBJECTIVES AND SUMMARY OF THE INVENTION

The above noted problem is effectively overcome by press striking the outer or peripheral portion of the die stamped metal frame which encompasses the outer portions of the so-patterned pins which at the end of the assembly and encapsulating process will emerge from the body of encapsulating resin. This press striking or "minting" of at least the outer pin portions of the die stamped metal frame is carried out between two press punches having surfaces perfectly parallel to each other and induces a plastic deformation of the metal of said outer portion of the pins which is sufficient to re-establish a perfect parallelism between their opposite faces. This press striking operation is carried out on the as die stamped metal frame, i.e. when the patterned pin portions are still connected together by residual metal bridges left by the die stamping, which will be finally broken during the assembly steps for rendering each individual pin electrically isolated from the adjacent ones and ready to be electrically connected to one of the pads of the semiconductor chip by means of a soldered wire. In this manner the press striking though re-establishing a correct parallelism and planarity of the outer portions of the pins does not deform in any appreciable way the geometry of the die stamped metal frame.

BRIEF DESCRIPTION OF THE DRAWINGS

The different aspects and advantages of the invention will become evident through the following description of a preferred embodiment thereof and through reference to the appended drawings, wherein.

DESCRIPTION OF THE BEST EMBODIMENT

Figure 1:
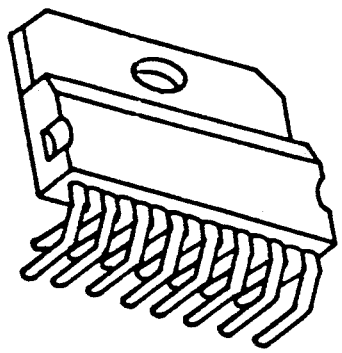
FIG. 1 is a prospective view of a typical Single-In-Line device wherein the electrical connection pins are arranged in two rows and bent to a certain angle.
Figure 2:
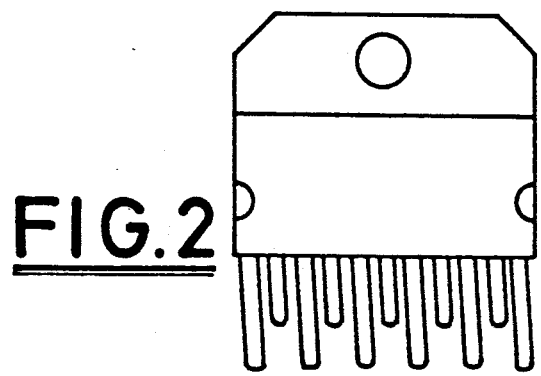
FIG. 2 is a plan view of the device of FIG. 1, wherein it is evidenced the lateral slanting of the pins after the bending thereof which may occur according to current practice.
Figure 3:
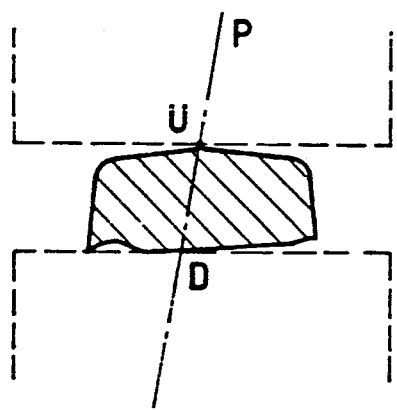
FIG. 3 is a schematic sectional view of a pin formed by the die stamping according to current practice.

The defect which may be easily observed in FIG. 2 is induced by the fact that the cross section of the various pins which are patterned by die stamping a strip of copper or nickel plated copper sheet from which the assembly metal frame of the semiconductor device is made, may present abutment lines of the bending punch and of the contrasting punch which are offset among each other. This is shown in FIG. 3 by joining these abutment lines with an imaginary secant plane identified by the dash-point line P. During bending, the bending punch abuts on the highest point U of the cross section while the contrasting punch exerts its restraining action on the point D (at least at the beginning of the bending). This offset between the pressure points creates a torque which induces a torsion on the pin which in turn determines the assumption of a slight lateral slanting thereof. This causes an effect such as the one depicted in FIG. 2 on the finished article.

Figure 4:
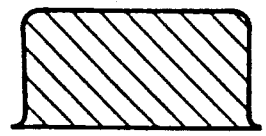
FIG. 4 shows the cross section of the same pin of FIG. 3 after having been subjected to the press striking in accordance with the present invention.

Preliminarily press striking the portion of the pins destined to be engaged eventually by the bending punches permits to overcome the problem described. The press striking is effected between two suitably shaped punches having the respective press surfaces essentially parallel and projectively opposed to each other. The pressure used in press striking or minting the relevant outer portion of the die stamped metal frame coinciding with the outer portions of the patterned pins is adjusted in order to ensure through a plastic deformation of the metal in the striked region the re-establishment of a sufficient planarity and parallelism between the top and bottom faces of the patterned metal constituting the pins. After this press striking the relevant cross section of the pins becomes as shown in FIG. 4.

As it may be noted, the bending punches of the pins upon completion of the assembly will act on pin surfaces which are essentially parallel to each other and the bending will no longer induce a torsion and a consequent lateral slanting as it occurs with unstriken pins having a cross section so as resulting from the die stamping, as schematically shown in FIG. 3.

Naturally the plastic deformation induced by the press striking step in the selected outer region of the die stamped metal frame should not exceed a certain limit in order to avoid to excessively work-harden the metal which must later be bent.

What I claim is:

1. A method of fabricating a metal frame and pin portion of a semiconductor device for preventing slanting of the pins of the packaged semiconductor device during the bending thereof between a bending punch and a cooperating contrasting punch, comprising die stamping a metal sheet to form said metal frame and a patterned pin portion attached thereto, subjecting to press striking between two punches having the respective press surfaces essentially parallel and projectively opposed to each other at least said patterned pin portion attached to and part of said metal frame for reestablishing planarity and parallelism of the opposite faces of said die stamped patterned pin portion, and wherein said press strikened pin portion will be subsequently subjected to said bending between a bending punch and a cooperating contrasting punch.

* * * * *